US 8,443,671 B2

(12) United States Patent
Classen et al.

(10) Patent No.: US 8,443,671 B2
(45) Date of Patent: May 21, 2013

(54) MICROMECHANICAL STRUCTURE AND METHOD FOR MANUFACTURING A MICROMECHANICAL STRUCTURE

(75) Inventors: Johannes Classen, Reutlingen (DE); Christian Bierhoff, Reutlingen (DE)

(73) Assignee: Robert Bosch GmbH, Stuttgart (DE)

(*) Notice: Subject to any disclaimer, the term of this patent is extended or adjusted under 35 U.S.C. 154(b) by 237 days.

(21) Appl. No.: 12/924,641

(22) Filed: Oct. 1, 2010

(65) Prior Publication Data

US 2011/0083506 A1 Apr. 14, 2011

(30) Foreign Application Priority Data

Oct. 6, 2009 (DE) .......................... 10 2009 045 391

(51) Int. Cl.
*G01P 15/125* (2006.01)
(52) U.S. Cl.
USPC ........................................ 73/514.32; 438/50
(58) Field of Classification Search
USPC ........................................ 73/514.32; 438/50
See application file for complete search history.

(56) References Cited

U.S. PATENT DOCUMENTS 5,639,542 A * 6/1997 Howe et al. ................ 73/514.32

FOREIGN PATENT DOCUMENTS

| DE | 196 39 946 | 4/1998 |
| DE | 197 19 770 | 11/1998 |
| DE | 10 2006 033 636 | 1/2008 |
| WO | WO 2004/010150 | 1/2004 |

* cited by examiner

*Primary Examiner* — John Chapman, Jr.
(74) *Attorney, Agent, or Firm* — Kenyon & Kenyon LLP

(57) ABSTRACT

A micromechanical structure includes: a substrate; a seismic mass movable relative to the substrate along a first direction parallel to a main plane of extension of the substrate; a first electrode structure is connected to the substrate; and a second electrode structure connected to the substrate. The seismic mass includes a counterelectrode structure having finger electrodes situated between first finger electrodes of the first electrode structure and second finger electrodes of the second electrode structure, along the first direction. The first electrode structure is fastened to the substrate by a first anchoring element in a central region of the micromechanical structure, and the second electrode structure is anchored to the substrate by a second anchoring element situated in the central region.

10 Claims, 5 Drawing Sheets

MICROMECHANICAL STRUCTURE AND METHOD FOR MANUFACTURING A MICROMECHANICAL STRUCTURE

BACKGROUND OF THE INVENTION

1. Field of the Invention

The present invention is directed to a micromechanical structure, e.g., a micromechanical sensor, and a method for manufacturing such a structure.

2. Description of Related Art

Such micromechanical structures are generally known. For example, an acceleration sensor is known from published German patent document DE 196 39 946 A1, in the form of a micromechanical component having a substrate which has a surface and a one-piece surface structure, the surface structure having movable electrodes which are suspended on spiral springs and are movable relative to the substrate, and the micromechanical component having fixed electrodes situated opposite from the movable electrodes and immovable relative to the substrate, the surface structure being fastened on the surface via at least two anchoring regions and otherwise extending away at a distance from the surface, and the at least two anchoring regions being spaced apart at a distance which is small compared to the lateral extension of the surface microstructure. A deflection of the surface structure relative to the substrate, for example due to external inertial forces, may be detected via a change in an electrical capacitance between the movable and the fixed electrodes. The first and second anchoring regions are situated in a central region of the micromechanical component, thus reducing mechanical stresses in the surface structure. A disadvantage of this system is that a differential evaluation of the deflection of the surface structure is not provided. Micromechanical acceleration sensors are also known from published German patent document DE 197 19 770 A1, published international patent application document WO 2004/010 150 A2, and published German patent application document DE 10 1006 033 636 A1.

BRIEF SUMMARY OF THE INVENTION

The micromechanical structure according to the present invention and the method according to the present invention for manufacturing a micromechanical structure provide the advantage over the related art that, with the aid of the first and the second electrode structures, a fully differential evaluation of a deflection of the seismic mass relative to the substrate may be achieved, and at the same time the first electrode structure as well as the second electrode structure are mounted on the substrate in a central region of the micromechanical structure in order to decouple stress. As a result, on the one hand high sensitivity and a comparatively good signal-to-noise ratio may be achieved in the detection of the deflection, and on the other hand, stress on the first and second electrode structures may be effectively decoupled from the substrate, thus increasing the offset stability, i.e., zero point stability, of the micromechanical structure. In particular, relative movements between the counterelectrode structure and the first and second electrode structures due to substrate warping, which otherwise would result in offset shifts, are thus avoided. Such substrate warping occurs, for example, in mold packages subjected to stress over the temperature range or the service life, and are caused in particular by differing coefficients of thermal expansion of the substrate material, the mold material, and/or an adhesive material. The substrate preferably includes a semiconductor substrate, and is particularly preferably a silicon substrate. The central region of the micromechanical structure includes in particular the center of the micromechanical structure parallel to the main plane of extension, as well as the surroundings of the center parallel to the main plane of extension, the maximum extension of the central region parallel to the main plane of extension preferably being 60 percent, particularly preferably 40 percent, and very particularly preferably 30 percent, of the maximum extension of the micromechanical structure parallel to the main plane of extension along the first direction or along a second direction which is perpendicular to the first direction. The micromechanical structure preferably includes an acceleration sensor, and particularly preferably includes a lateral acceleration sensor having a sensing direction oriented parallel to the main plane of extension. The substrate preferably has printed conductors for electrically contacting the first and/or second electrode structure and/or the seismic mass. The first anchoring element preferably includes a plurality of first anchoring elements situated in the central region, while the second anchoring element preferably includes a plurality of second anchoring elements situated in the central region.

According to one example embodiment, it is provided that the seismic mass is coupled to a third anchoring region situated in the central region, the seismic mass preferably being elastically coupled to the third anchoring region via spring elements. In this way, the seismic mass is advantageously attached in the central region of the micromechanical structure, thus greatly reducing the risk of relative movement between the counterelectrode structure on the one hand and the first and second electrode structures on the other hand solely as the result of substrate warping. In particular, the first, second, and/or third anchoring elements are essentially congruent with one another along a second direction which is perpendicular to the first direction and parallel to the main plane of extension, and/or are each centrally situated relative to the micromechanical structure along the first direction.

According to one example embodiment, it is provided that the first electrode structure has a first connection region situated at least partially between the second electrode structure and the substrate, and in particular between the second finger electrodes and the substrate, perpendicular to the main plane of extension. The first connection region advantageously allows bridging of the second electrode structure, and thus a crossover of two electrically separated regions which is cantilevered, i.e., decoupled from the substrate, i.e., in particular a crossover of the first and second electrode structures, without the need for attaching the substrate to the first and second electrode structures. Such a crossover makes it possible in particular to achieve fully differential evaluation; i.e., each of the third finger electrodes is always situated between the first and second finger electrodes, while at the same time it is possible to anchor the first and second electrode structures as well as the counterelectrode structure in the central region. In addition, this greatly simplifies the line routing within the micromechanical structure, so that the micromechanical structure is comparatively compact.

According to one example embodiment, it is provided that the first finger electrodes are fastened to the first anchoring element via the first connection region. Electrical contacting and mechanical attachment of the first finger electrodes to the first anchoring element are thus advantageously achieved, independently from the second electrode structure, since the first connection region for attachment of the first finger electrodes partially extends between the substrate and the second electrode structure (perpendicular to the main plane of extension).

According to one example embodiment, it is provided that the second electrode structure has a second connection region which is situated at least partially between the first electrode structure and the substrate, and in particular between the first finger electrodes and the substrate, perpendicular to the main plane of extension. Bridging of the first electrode structure by the cantilevered second connection region is also advantageously achieved in this way, thus in turn achieving a crossover of the first and second electrode structures.

According to one example embodiment, it is provided that the second finger electrodes are fastened to the second anchoring element via the second connection region. Electrical contacting and mechanical attachment of the second finger electrodes to the second anchoring element are thus advantageously achieved, independently from the first electrode structure.

According to one example embodiment, it is provided that the first connection region perpendicular to the main plane of extension is thinner than the first finger electrodes, and/or that the second connection region perpendicular to the main plane of extension is thinner than the second finger electrodes, so that the first and/or second connection region may be structured comparatively easily during manufacture of the micromechanical structure. In addition, topography problems in the lithography and micromechanical structuring of subsequent planes are minimized.

A further subject matter of the present invention is a method for manufacturing a micromechanical structure, the substrate being provided in a first manufacturing step, the first and the second anchoring element being produced in a second manufacturing step, a first connection region of the first electrode structure and/or a second connection region of the second electrode structure being produced in a third manufacturing step, and the first finger electrodes of the first electrode structure and the second finger electrodes of the second electrode structure being produced in a fourth manufacturing step, the first connection region being connected to the first finger electrodes, and/or the second connection region being connected to the second finger electrodes. In the third manufacturing step, in particular the first connection region is connected to the first anchoring element, and/or the second connection region is connected to the second anchoring element. Thus, a cantilevered attachment of the first finger electrodes to the first anchoring element, independent of the geometry of the second electrode structure, is advantageously made possible, since the first connection region perpendicular to the main plane of extension extends at least partially between the substrate and the second electrode structure. Conversely, additionally or alternatively a cantilevered attachment of the second finger electrodes to the second anchoring element, independent of the geometry of the first electrode structure, is possible since the second connection region perpendicular to the main plane of extension extends at least partially between the substrate and the first electrode structure. Thus, as described in detail above, a micromechanical structure is advantageously manufactured which allows a fully differential evaluation, and at the same time allows an attachment of the first and second electrode structures in the central region.

According to one example embodiment, it is provided that a third anchoring element is also produced in the second manufacturing step, and that the seismic mass is also produced in the fourth manufacturing step, the seismic mass being coupled to the third anchoring element via spring elements. Thus, the seismic mass is also advantageously coupled to the substrate in the central region of the micromechanical structure, resulting in a maximum stress decoupling of the micromechanical structure from substrate warping despite a fully differential electrode system.

According to one example embodiment, it is provided that between the first and the third manufacturing steps a first sacrificial layer is deposited on the substrate and structured, and that between the third and fourth manufacturing steps a second sacrificial layer is deposited on the first and/or second connection region and structured, the first and second sacrificial layers being etched in a fifth manufacturing step. A comparatively simple and cost-effective manufacture of the cantilevered structures, i.e., in particular of the first, second, and third finger electrodes, of the seismic mass, as well as of the first and second connection regions is advantageously achieved in this way.

DETAILED DESCRIPTION OF THE INVENTION

Figure 1:
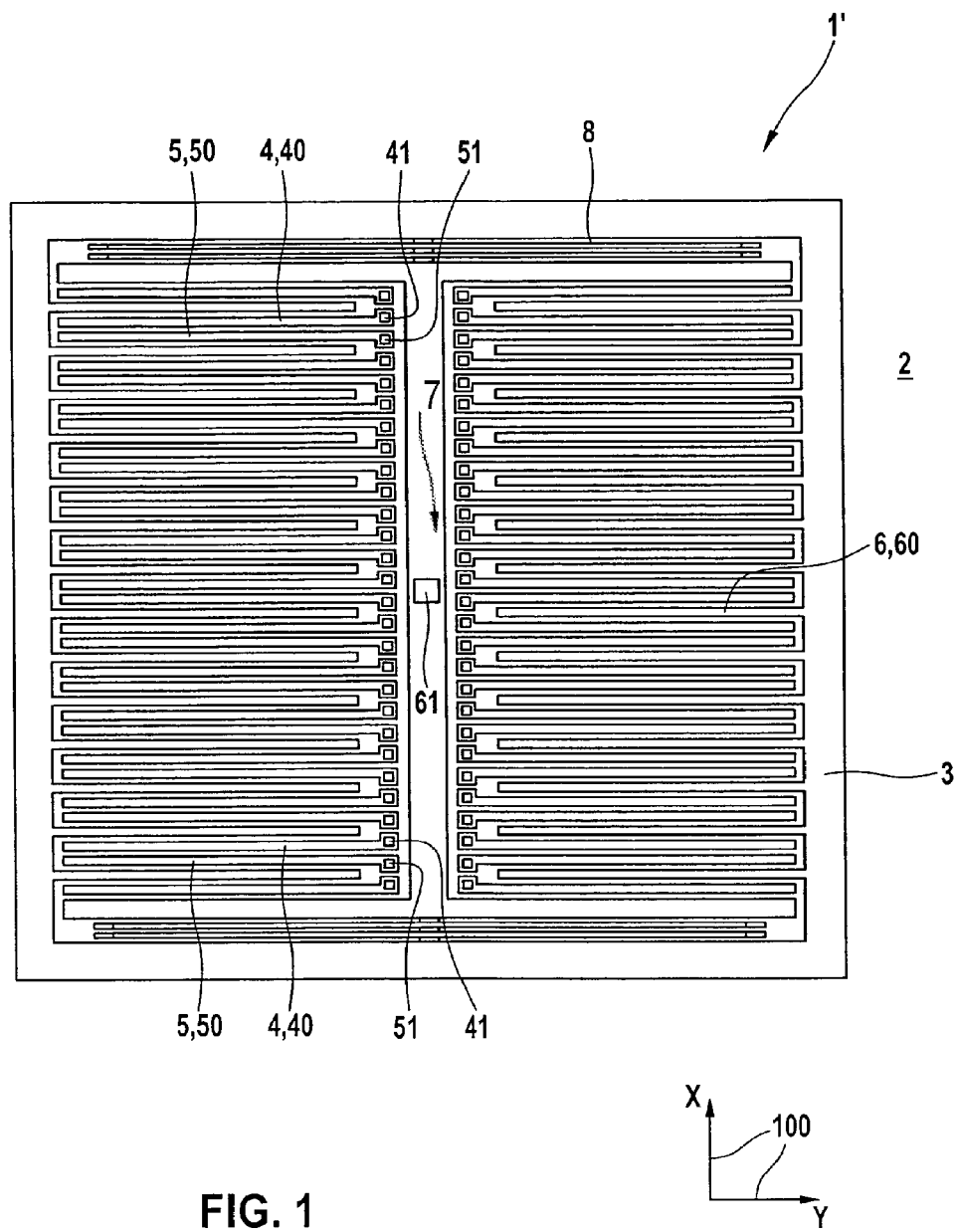
FIG. 1 shows a schematic top view of a micromechanical structure according to the related art.

FIG. 1 illustrates a schematic top view of a micromechanical structure 1' according to the related art. Micromechanical structure 1' includes a substrate 2 which has a main plane of extension 100, and a seismic mass 3 which is movable relative to substrate 2. Seismic mass 3 is coupled via spring elements 8 to a third anchoring element 61 which is fixedly connected to substrate 2 in a central region 7 of micromechanical structure 1'. Seismic mass 3 also includes a counterelectrode structure 6 which has a plurality of third finger electrodes 60. Micromechanical structure 1' also includes a first and a second electrode structure 4, 5. First electrode structure 4 includes cantilevered first finger electrodes 40 which are each fastened to substrate 2 via independent first anchoring elements 41. Second electrode structure 5 includes cantilevered second finger electrodes 50 which likewise are each fastened to substrate 2 via independent second anchoring elements 51. Third finger electrodes 60 are each situated between a first and a second finger electrode 40, 50 along a first direction X, also referred to as the sensing direction, which is parallel to a main plane of extension 100. First and second electrode structures 4, 5 are electrically insulated from one another, so that a fully differential evaluation of a deflection of seismic mass 3 relative to substrate 2 along first direction X is possible. If the first and second electrode structures 4, 5 are not attached to substrate 2 solely in central region 7 of micromechanical structure 1, a disadvantageous result occurs in that a substrate warping results in a relative movement between first and second finger electrodes 40, 50 relative to third finger electrodes 60, and thus a zero point shift or offset is produced.

Figure 2:
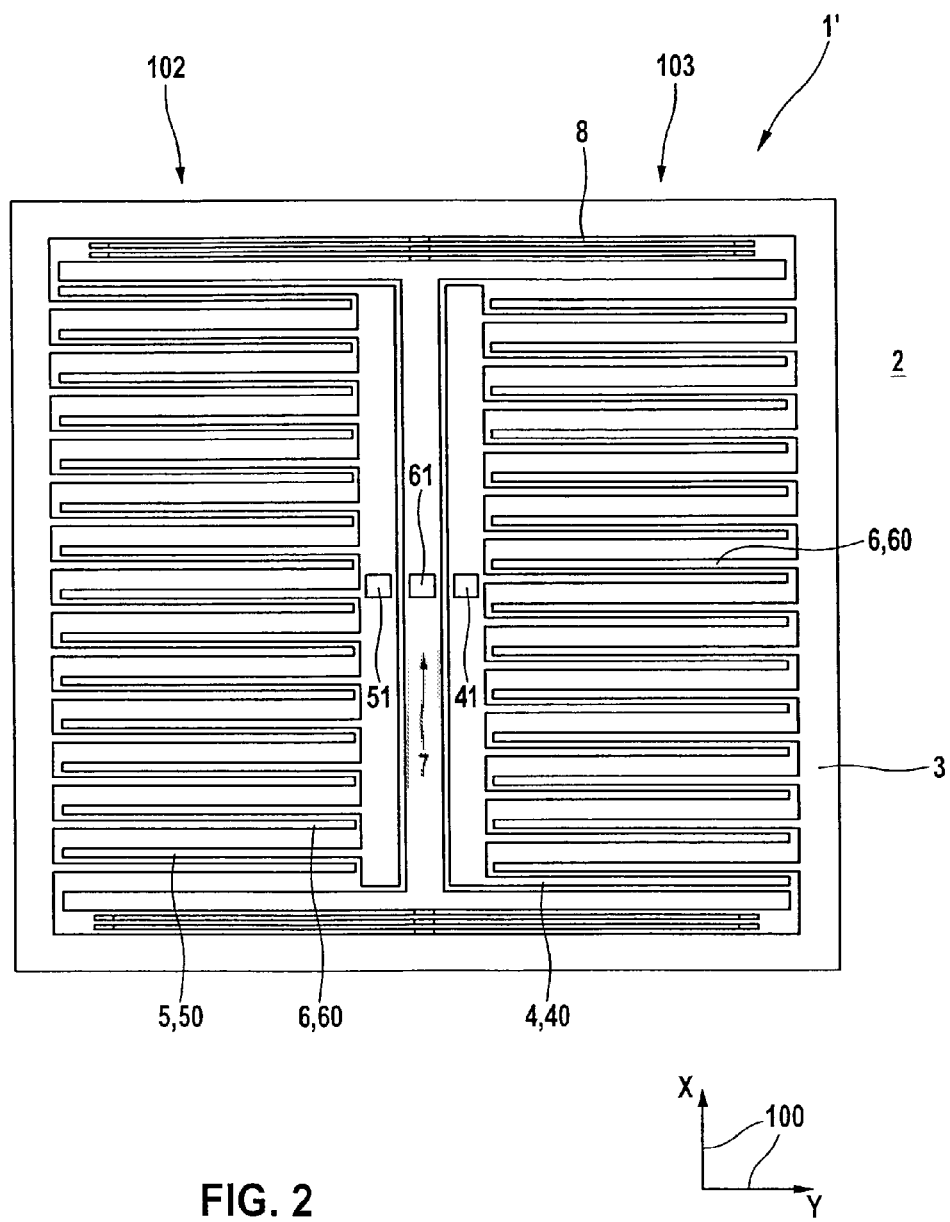
FIG. 2 shows a schematic top view of another micromechanical structure according to the related art.

FIG. 2 illustrates a schematic top view of a further micromechanical structure 1' according to the related art which is essentially similar to micromechanical structure 1' illustrated in FIG. 1, first finger electrodes 40 all being fastened to substrate 2 via a single first anchoring element 41, and second finger electrodes 50 all being fastened to substrate 2 via a single second anchoring element 51, first and second anchoring elements 41, 51 being situated in central region 7 of micromechanical structure 1. First electrode structure 4 is situated only on a first side 102 of seismic mass 3, and second electrode structure 5 is situated only on a second side 103 of seismic mass 3, in each case relative to a second direction Y which is perpendicular to a first direction. Therefore, in contrast to micromechanical structure 1' according to FIG. 1, each of third finger electrodes 60 is not situated between a first and a second finger electrode 40, 50 along first direction X. A fully differential evaluation of the deflection of seismic mass 3 is therefore not possible.

Figure 3:
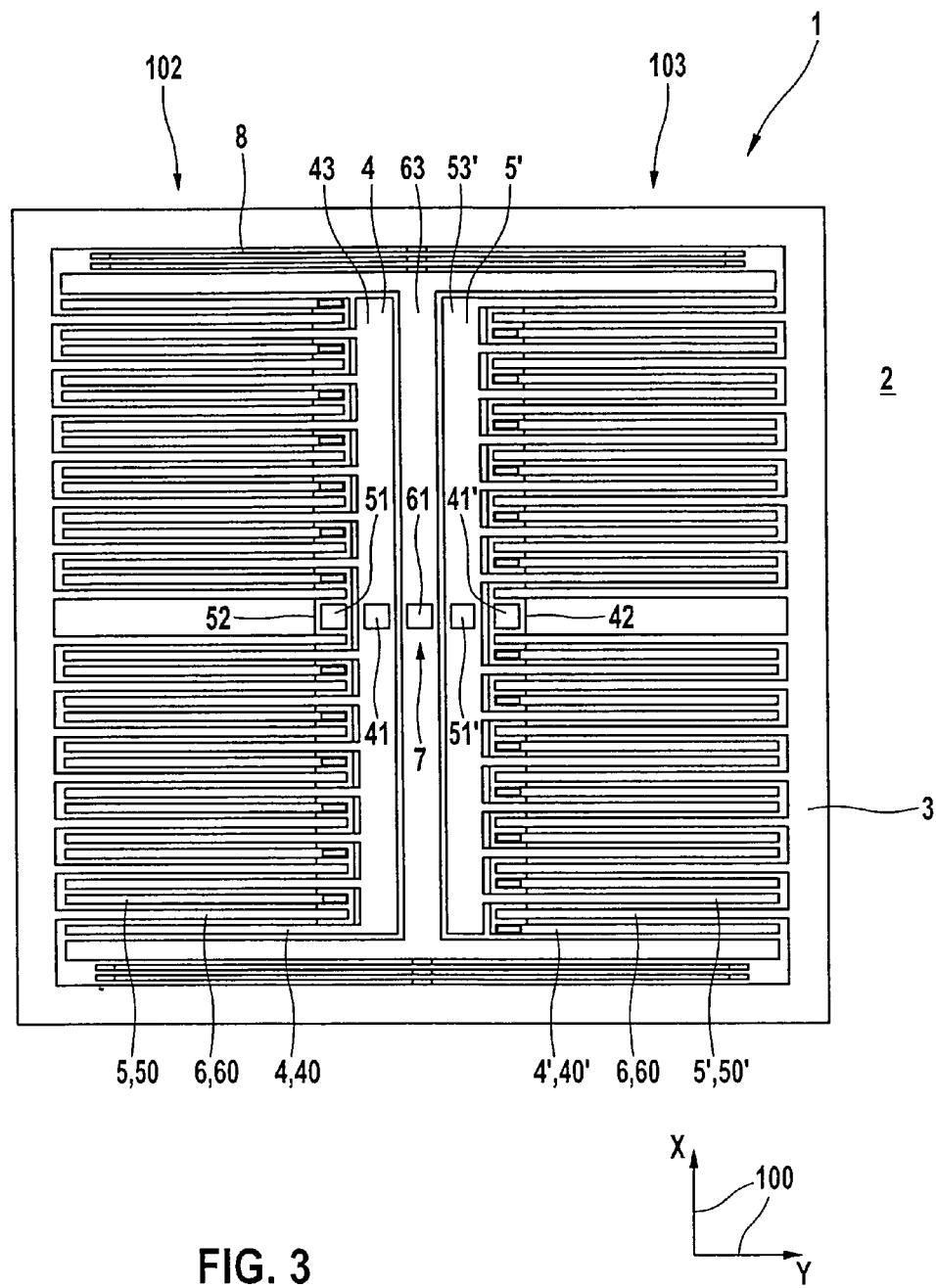
FIG. 3 shows a schematic top view of a micromechanical structure according to a first example embodiment of the present invention.

FIG. 3 illustrates a schematic top view of a micromechanical structure 1 according to a first example embodiment of the present invention, the first specific embodiment being essentially similar to micromechanical structures 1' illustrated in FIGS. 1 and 2, each third finger electrode 60 being situated between a first and a second finger electrode 40, 50 along first direction X, i.e., along the sensing direction, and at the same time all first finger electrodes 40 being fastened to substrate 2 on first side 102 via a first anchoring element 41, and all second finger electrodes 50 being fastened to substrate 2 on first side 102 via a second anchoring element 51, first and second anchoring elements 41, 51 being situated only in central region 7.

According to the first example embodiment, micromechanical structure 1 thus makes a fully differential evaluation possible, and at the same time is comparatively insensitive to substrate warping. On first side 102 of micromechanical structure 1, first finger electrodes 40 are directly connected to first anchoring element 41 via a first beam element 43 which extends essentially along first direction X. First finger electrodes 40 and first beam element 43 have a cantilevered design, i.e., are situated at a distance from substrate 2, perpendicular to main plane of extension 100. Second finger electrodes 50 are mechanically connected in an electrically conductive manner to second anchoring element 51 via a second connection region 52, second connection region 52 extending partially between substrate 2 and first electrode structure 4 for passing under first electrode structure 4, i.e., first beam element 43, perpendicular to main plane of extension 100. Second finger electrodes 50 and second connection region 52 have a cantilevered design. Similarly, on second side 3 further second finger electrodes 50' are directly mechanically connected in an electrically conductive manner to a further second beam element 53', further first finger electrodes 40' being connected to a further first anchoring element 41' via a first connection region 42. First connection region 42 is at least partially situated between substrate 2 and further second electrode structure 5', in particular further second finger electrodes 50', perpendicular to main plane of extension 100. Spring elements 8 are connected to third anchoring element 61 with the aid of a third beam element 63, third beam element 63 being situated between first and further second beam element 43, 53' along second direction Y. In addition, first, second, further first, further second, and third anchoring elements 41, 51, 41', 51', 61 are situated in central region 7, third anchoring element 61 being situated between first and further second anchoring elements 41, 51' along second direction Y. Seismic mass 3 in particular includes an outer frame which completely encloses micromechanical structure 1. First, second, further first, and further second and/or third anchoring elements 41, 51, 41', 51', 61 are essentially congruent with one another in particular along second direction Y, and along first direction X are each centrally situated relative to micromechanical structure 1. Perpendicular to main plane of extension 100, first and second connection regions 42, 52 are thinner than first, further first, further second, and second finger electrodes 40, 40', 50', 50, and/or are thinner than first and further second beam elements 43, 53'.

Figure 4:
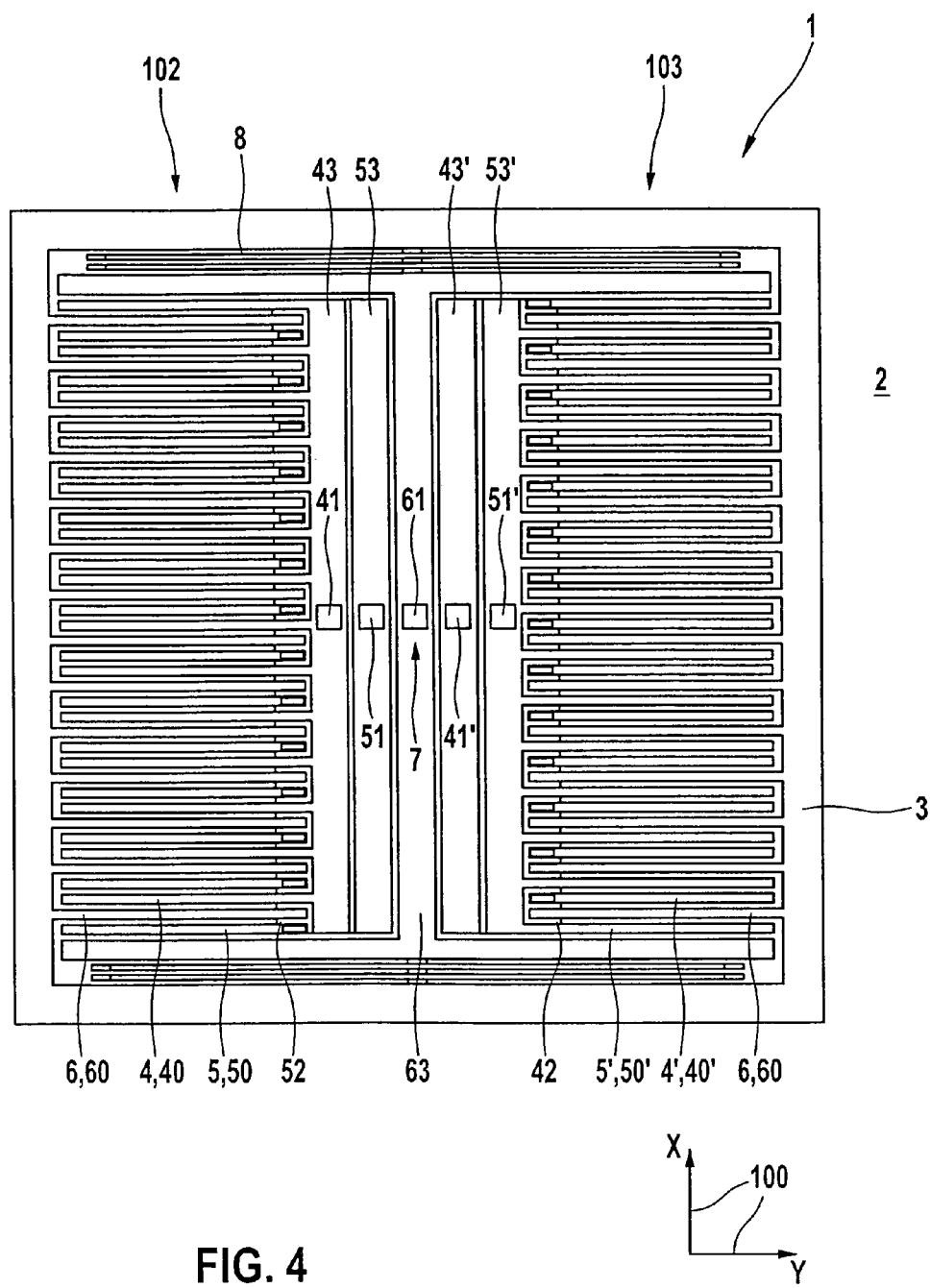
FIG. 4 shows a schematic top view of a micromechanical structure according to a second example embodiment of the present invention.

FIG. 4 illustrates a schematic top view of a micromechanical structure 1 according to a second example embodiment of the present invention, the second example embodiment being essentially similar to the first example embodiment illustrated in FIG. 3, on first side 102 second connection region 52 not being directly connected to second anchoring element 51, but rather, second connection region 52 being connected to a second beam element 53 which in turn is connected to second anchoring element 51. This second beam element 53 is situated between first beam element 43 and third beam element 63 on first side 102 and along second direction Y. Second connection region 52 is situated partially between substrate 2 and first beam element 43, perpendicular to main plane of extension 100, and is used to contact through second finger electrodes 50 and fasten them beneath first beam element 43. Similarly, on second side 103 a further first beam element 43' is situated between first connection region 42 and further first anchoring element 41', which on second side 103 is situated between third beam element 63 and further second beam element 53' along second direction Y. First, further first, further second, second, and/or third anchoring elements 41, 41', 51', 51, 61 once again are essentially congruent with one another along second direction Y, and along first direction X are each centrally situated relative to micromechanical structure 1. Compared to the first example embodiment, second beam element 53 provides stiffening of second connection region 52 on first side 102, while further first beam element 43' provides stiffening of first connection region 42 on second side 103.

Figure 5:
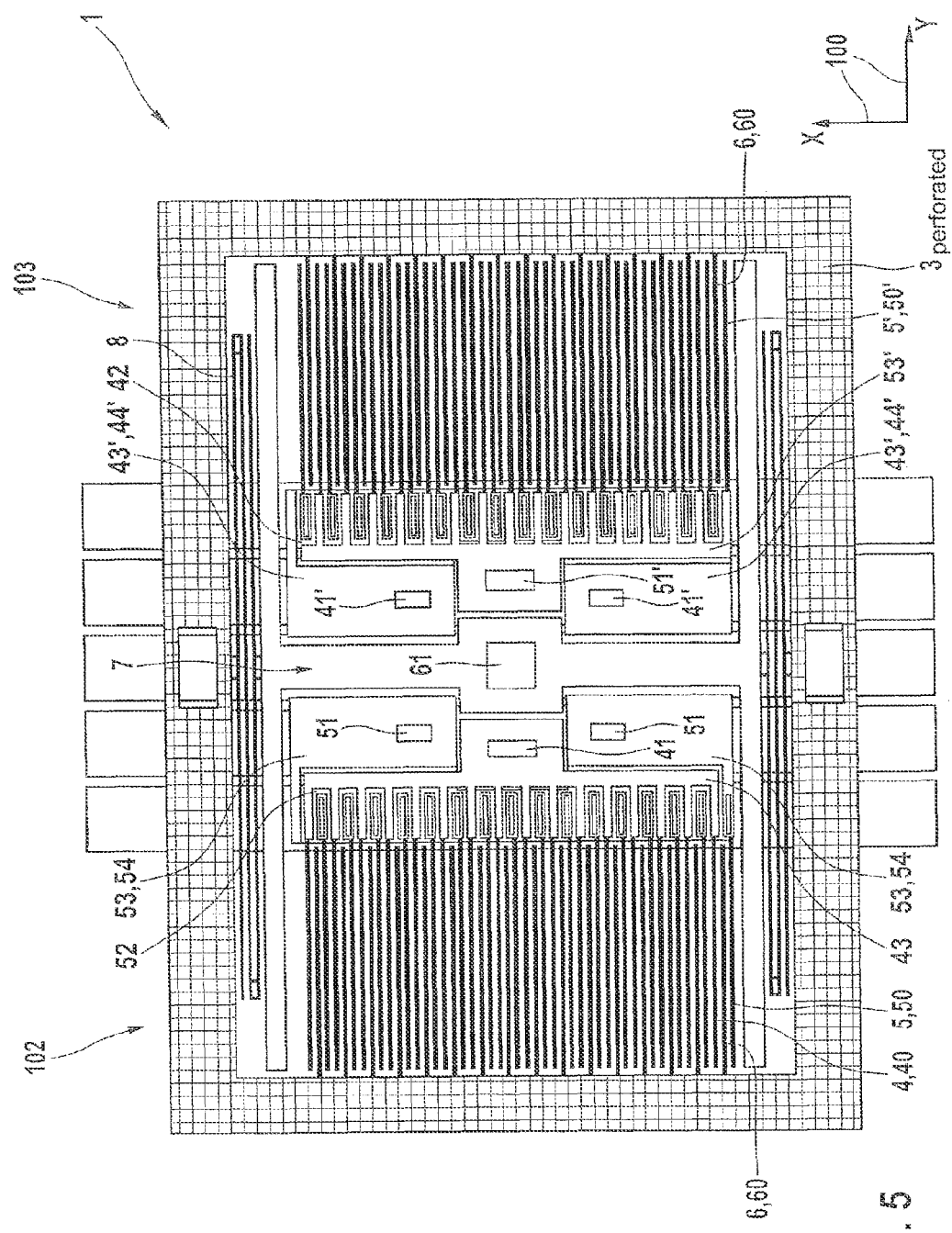
FIG. 5 shows a schematic top view of a micromechanical structure according to a third example embodiment of the present invention.

FIG. 5 illustrates a schematic top view of a micromechanical structure 1 according to a third example embodiment of the present invention, the third example embodiment being essentially similar to the second example embodiment illustrated in FIG. 4, on first side 102 second beam element 53 being interrupted along first direction X and divided into two second beam element partial sections 54, each second beam element partial section 54 having a second anchoring element 51 in central region 7. First anchoring element 41 is situated, and first beam element 43 is at least partially situated, between second beam element partial sections 54 along first direction X. Similarly, on second side 103 further first beam element 43' is interrupted along first direction X and divided into two further first beam element partial sections 44', each further first beam element partial section 44' having a further first anchoring element 41' in central region 7. Further second anchoring element 51' is situated, and further second beam element 53' is at least partially situated, between further first beam element partial sections 44' along first direction X. On first side 102 first beam element 43 advances, and on second side further second beam element 53' advances, toward third beam element 63, so that, compared to the second specific embodiment, an overall more compact configuration of micromechanical structure 1 and thus a higher base capacitance is achieved. Seismic mass 3 includes, for example, a perforated seismic mass 3. In addition, strictly as an example, printed conductors are provided beneath micromechanical structure 1 for contacting first, second, further first, and/or further second electrode structures 4, 5, 4', 5', and/or seismic mass 3.

What is claimed is:
1. A micromechanical structure, comprising:
  a substrate having a main plane of extension;
  a seismic mass movable relative to the substrate along a first direction parallel to the main plane of extension;

a first electrode structure connected to the substrate and having first finger electrodes; and a second electrode structure connected to the substrate and having second finger electrodes;

wherein the seismic mass includes a counterelectrode structure having third finger electrodes situated between the first finger electrodes of the first electrode structure and the second finger electrodes of the second electrode structure, along the first direction;

wherein all the first finger electrodes of the first electrode structure are fastened to the substrate with the aid of a first anchoring element situated in a central region of the micromechanical structure, and wherein all the second finger electrodes of the second electrode structure are anchored to the substrate with the aid of a second anchoring element situated in the central region.

2. The micromechanical structure as recited in claim 1, wherein the seismic mass is coupled to a third anchoring region situated in the central region, the seismic mass being elastically coupled to the third anchoring region by at least one spring element.

3. The micromechanical structure as recited in claim 2, wherein the first electrode structure has a first connection region situated at least partially between the second finger electrodes of the second electrode structure and the substrate, perpendicularly to the main plane of extension.

4. The micromechanical structure as recited in claim 3, wherein the first finger electrodes are fastened to the first anchoring element at the first connection region.

5. The micromechanical structure as recited in claim 3, wherein the second electrode structure has a second connection region situated at least partially between the first finger electrodes of the first electrode structure and the substrate, perpendicularly to the main plane of extension.

6. The micromechanical structure as recited in claim 5, wherein the second finger electrodes are fastened to the second anchoring element at the second connection region.

7. The micromechanical structure as recited in claim 3, wherein the first connection region situated perpendicular to the main plane of extension is thinner than the first finger electrodes.

8. The micromechanical structure as recited in claim 5, wherein the second connection region situated perpendicular to the main plane of extension is thinner than the second finger electrodes.

9. A method for manufacturing a micromechanical structure, comprising:

providing a substrate;

producing a first anchoring element, a second anchoring element, and a third anchoring element;

producing a first connection region coupled to the first anchoring element for a first electrode structure and a second connection region coupled to the second anchoring element for a second electrode structure;

producing first finger electrodes of the first electrode structure, second finger electrodes of the second electrode structure, and a seismic mass, wherein the seismic mass is coupled to the third anchoring element by at least one spring element, wherein the seismic mass includes a counterelectrode structure having third finger electrodes and is situated between the first finger electrodes of the first electrode structure and the second finger electrodes of the second electrode structure;

connecting the first connection region to the first finger electrodes of the first electrode structure; and connecting the second connection region to the second finger electrodes of the second electrode structure.

10. The method as recited in claim 9, wherein:

between the step of providing the substrate and the step of producing the first and second connection regions, providing a first sacrificial layer on the substrate and structuring the first sacrificial layer; and between the step of producing the first and second connection regions and the step of producing the first finger electrodes, the second finger electrodes, and the seismic mass, providing a second sacrificial layer on the first and second connection regions and structuring the second sacrificial layer.

* * * * *